United States Patent
Chen et al.

(10) Patent No.: US 6,221,174 B1
(45) Date of Patent: Apr. 24, 2001

(54) METHOD OF PERFORMING TITANIUM/TITANIUM NITRIDE INTEGRATION

(75) Inventors: Fufa Chen, Cupertino; Yin Lin, Mountain View; Jianhua Hu, Sunnyvale; Frederick Wu, Cupertino; Ming Xi, Milpitas; Li Wu, Fremont, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/248,869

(22) Filed: Feb. 11, 1999

(51) Int. Cl.$^7$ ....................................... C23C 8/24

(52) U.S. Cl. ................... 148/237; 148/281; 148/283; 427/327; 427/343; 427/419.7

(58) Field of Search ................... 148/238, 281, 148/283, 247, 237; 427/301, 327, 343, 419.7

(56) References Cited

U.S. PATENT DOCUMENTS

| | | | |
|---|---|---|---|
| 4,897,709 | 1/1990 | Yokoyama et al. | 357/68 |
| 5,175,126 | 12/1992 | Ho et al. | 437/190 |
| 5,192,589 | 3/1993 | Sandhu | 427/255 |
| 5,279,857 | 1/1994 | Eichman et al. | 427/255 |
| 5,308,655 | 5/1994 | Eichman et al. | 427/248.1 |
| 5,312,774 | 5/1994 | Nakamura et al. | 437/192 |
| 5,378,501 | 1/1995 | Foster et al. | 427/255.2 |

(List continued on next page.)

FOREIGN PATENT DOCUMENTS

| | | |
|---|---|---|
| 397 131 A2 | 11/1990 | (EP) . |
| 720 214 A2 | 7/1996 | (EP) . |

(List continued on next page.)

OTHER PUBLICATIONS

M.E. Gross, E. Coleman, K. Ohto, "Effect of NH$_3$ Plasma Treatment on Etching of Ti During TiCl$_4$ Baed TiN CVC Processes", Material Res. Soc. Symp. Proc. vol 514, pp. 523–529.

J.T. Hillman, D. W. Studiner "Controlling the Properties of LPCVD Titanium Nitride", VMIC Conference, Jun. 9–10, 1992.

N. Yokoyama, K. Hinode, Y. Homma, "LPCVD Titanium Nitride for ULSIs", J. Electrochem. Soc. vol. 138, No. 1, Jan. 1991 pp 190–195.

K. Mori, M. Akazawa, M. Iwasaki, H. Ito, K. Tsukamoto, Y. Akasaka, "Contract Plug Formed with Chemical Vapour Deposited TiN", 1991 Int'l Conference on Solid State Devices and Materials, Yokohama, 1991, pp. 210–212.

S.R. Kurtz, R.G. Gordon, "Chemical Vapor Deposition of Titanium Nitride at Low Temperatures", Thin Solid Films, vol. 140, pp 277–290 (1986).

M.J. Buiting, A. F. Otterloo, A. H. Montree, "Kinetical Aspects of the LPCVD of Titanium Nitride from Titanium Tetrachloride and Ammonia", J. Electrochem Soc., vol. 138, No. 2, Feb. 1991, pp 500–505.

(List continued on next page.)

Primary Examiner—John Sheehan
Assistant Examiner—Andrew L. Oltmans
(74) Attorney, Agent, or Firm—Thomason, Moser & Patterson

(57) ABSTRACT

The present invention is a method of wafer processing which improves the reliability of an integrated titanium (Ti)/titanium nitride (TiN) CVD film formed from a reaction of titanium tetrachloride (TiCi$_4$) and ammonia (NH$_3$). A Ti film is subject to a treatment of NH$_3$ gas to render the Ti film unreactive towards attack by chlorine and hydrogen chloride. A thin seed layer of TiN film is deposited upon the treated Ti film using a thermal TiCl$_4$/NH$_3$ reaction. Subsequent TiN film deposition upon the seed layer results in a successful integration of a Ti/TiN film stack for a Ti film thickness up to about 300 Å.

22 Claims, 4 Drawing Sheets

U.S. PATENT DOCUMENTS

| | | | |
|---|---|---|---|
| 5,378,660 | 1/1995 | Ngan et al. | 437/247 |
| 5,416,045 | 5/1995 | Kauffman et al. | 437/174 |
| 5,420,072 * | 5/1995 | Fiordalice et al. | 437/192 |
| 5,567,483 | 10/1996 | Foster et al. | 427/535 |
| 5,593,511 | 1/1997 | Foster et al. | 148/238 |
| 5,610,106 | 3/1997 | Foster et al. | 437/245 |
| 5,624,868 | 4/1997 | Iyer | 438/762 |
| 5,789,321 * | 8/1998 | Ohsita | 438/680 |
| 5,866,213 | 2/1999 | Foster et al. | 427/573 |

FOREIGN PATENT DOCUMENTS

| | | |
|---|---|---|
| 63-229814 | 9/1988 | (JP) . |
| 10-209077 | 8/1998 | (JP) . |
| WO 95/33865 * | 12/1995 | (WO) . |

OTHER PUBLICATIONS

M. Eizenberg, "Chemical Vapor Deposition of TiN for ULSI Applications", Mat. Res. Soc. Symp. Proc. vol. 427, 1996, pp 325–335.

Bouteville et al. "Low Temperature Rapid Thermal Low Pressure Chemical Vapor Deposition of (111) Oriented TiN Layers from the $TiCl_4$–$NH_3$–$H_2$ Gaseous Phase" Microelectronic Engineering 37/38 , pp. 421–425, 1997.

Erkov et al. "Deposition and Properties of Titanium Nitride Films Obtained by $TiCl_4$ Ammonolysis in the LPCVD Process" Russian Microelectronics, vol. 27, No. 3, pp. 183–187, 1998.

* cited by examiner

TABLE 1-Ti/TiN integration recipe (Ti<250Å, TiN = 200Å)

|  | (1) SET FLOW | (2) SET TV | (3) TREAT | (4) LFM OPEN | (5) INITIAL DEP | (6) DEPOS | (7) TiCl4 OFF | (8) PURGE | (9) PUMP |
|---|---|---|---|---|---|---|---|---|---|
| TIME | 3 sec | 3 sec | A sec* | 10 sec | 7.5 sec | 15 sec | 20 sec | 10 sec | 3 sec |
| THROTTLE | fully open | 530 |  |  |  |  |  | fully open | fully open |
| PRESSURE |  |  | 10 torr | 10 torr | 10 torr | 10 torr | 10 torr |  |  |
| He(sccm) | 1000 | 1000 | 1000 | 1000 | 1000 | 1000 | 1000 | 1000 |  |
| N2(sccm) | 1000 | 1000 | 1000 | 1000 | 1000 | 1000 | 1000 | 1000 | 60 |
| Ar Dil. (sccm) | 1000 | 1000 | 1000 | 1000 | 1000 | 1000 | 1000 | 1000 | 60 |
| NH3 (sccm) |  |  | 500 | 500 | 500 | 100 | 500 |  |  |
| PRG Ar (sccm) | 2000 | 2000 | 2000 | 2000 | 2000 | 2000 | 2000 | 2000 | 120 |
| TiCl4 |  |  |  | 1 mg/min. | 70 mg/min. (~8sccm) | 170 mg/min. (~20sccm) |  |  |  |
| *NOTE: | Ti thickness | <150Å | 200Å | 250Å |  |  |  |  |  |
|  | Time: A | 10 sec | 50 sec | 70 sec |  |  |  |  |  |

FIG. 3a

TABLE 2-Ti/TiN integration recipe (250Å < Ti < 300Å, TiN = 200Å)

| | (1) SET FLOW | (2) SET TV | (3) TREAT | (4) LFM OPEN | (5) INITIAL DEP | (6) TREAT | (7) TiCl4 ON | (8) DEPOS | (9) TiCl4 OFF | (10) PURGE | (11) PUMP |
|---|---|---|---|---|---|---|---|---|---|---|---|
| TIME | 3 sec | 3 sec | 80 sec | 10 sec | 7.5 sec | 20 sec | 5 sec | 15 sec | 20 sec | 10 sec | 3 sec |
| THROTTLE | fully open | 530 | | | | | | | | fully open | fully open |
| PRESSURE | | | 10 torr | 10 torr | 10 torr | | 10 torr | 10 torr | 10 torr | | |
| He(sccm) | | 1000 | 1000 | 1000 | 1000 | 1000 | 1000 | 1000 | 1000 | 1000 | |
| N2(sccm) | 1000 | 1000 | 1000 | 1000 | 1000 | 1000 | 1000 | 1000 | 1000 | 1000 | 60 |
| Ar Dil.(sccm) | 1000 | 1000 | 1000 | 1000 | 1000 | 1000 | 1000 | 1000 | 1000 | 1000 | 60 |
| NH3(sccm) | | | 500 | 500 | 500 | 500 | 100 | 100 | 500 | | |
| PRG Ar(sccm) | 2000 | 2000 | 2000 | 2000 | 2000 | 2000 | 2000 | 2000 | 2000 | 2000 | 120 |
| TiCl4 | | | | 1 mg/min. | 70 mg/min. (~8sccm) | | 130 mg/min. (~15sccm) | 170 mg/min. (~20sccm) | | | |

FIG. 3b

METHOD OF PERFORMING TITANIUM/ TITANIUM NITRIDE INTEGRATION

BACKGROUND OF THE DISCLOSURE

1. Field of the Invention

The invention relates to a method of thin film processing and, more particularly, it relates to a method of forming an integrated film stack of titanium and titanium nitride with improved reliability.

2. Description of the Background Art

In the manufacture of integrated circuits, a titanium nitride film is often used as a metal barrier layer to inhibit the diffusion of metals into an underlying region beneath the barrier layer. These underlying regions include transistor gates, capacitor dielectric, semiconductor substrates, metal lines, and many other structures that appear in integrated circuits.

For example, when an electrode is being formed for a transistor's gate, a diffusion barrier is often formed between the gate material and a metal that serves as the contact portion of the electrode. The diffusion barrier inhibits the diffusion of the metal into the gate material, which may be composed of polysilicon. Such metal diffusion is undesirable because it would change the characteristics of the transistor, or render it inoperative.

When the underlying region is silicon (Si), it is also desirable to use a titanium/titanium nitride (Ti/TiN) combination as a barrier layer. Since the contact resistivity of Ti to Si is significantly lower than that of TiN to Si, the use of Ti to contact the underlying Si will lead to a lower contact resistance, while the TiN layer will act as an effective barrier against diffusion of metal into the underlying silicon.

Ti and TiN films can be formed by physical or chemical vapor deposition. A Ti/TiN combination barrier layer may be formed in a multiple chamber "cluster tool" by depositing a Ti film in one chamber followed by TiN film deposition in another chamber. When depositing both Ti and TiN using chemical vapor deposition (CVD), titanium tetrachloride ($TiCl_4$), for example, may be used to form both Ti and TiN films when allowed to react with different reactant gases.

However, when a $TiCl_4$-based chemistry is used in such an integrated Ti/TiN film process, a reliability problem is encountered. In particular, it has been found that if the thickness of the Ti film exceeds about 120 Å, the integrated Ti/TiN stack structure will either peel off or exhibit a haze that is indicative of poor film quality. This problem can be overcome by special treatment of the Ti film after Ti deposition. For example, if the Ti film is first subjected to a rapid thermal nitrogen (RTN) treatment, the subsequently deposited TiN film will not exhibit film failure in the form of peeling or haze. However, the drawback for this approach is that the additional process step of RTN can only be performed in a separate piece of equipment outside of the cluster tool. If the Ti film is formed from a high temperature CVD Ti process, the need for the additional RTN step decreases the process throughput. In general, an extra process step requiring additional wafer handling and transfer among different equipment translates to extra cost and additional risk for wafer contamination or breakage. Since Ti and TiN deposition are usually performed within different chambers in a cluster tool, the need for an additional step such as RTN would defeat the purpose of using a cluster tool for this Ti/TiN application.

Therefore, a need exists in the art for a method of forming a reliable Ti/TiN diffusion barrier in an integrated process.

SUMMARY OF THE INVENTION

The disadvantages associated with the prior art are overcome by the present invention of a method of forming an integrated Ti/TiN film structure by implementing two process steps between the Ti and TiN film deposition. The first step exposes the Ti film to an ammonia ($NH_3$) environment under a high temperature condition. The second step deposits a thin seed layer of TiN film using a thermal $TiCl_4/NH_3$ reaction under a $NH_3$-rich condition. After depositing about 50 Å of the TiN seed layer, the process proceeds with TiN deposition under the normal condition. The combination of the $NH_3$ treatment and seed layer formation steps allows a successful Ti/TiN film integration for Ti film thickness up to about 300 Å, while the use of either step alone allows successful integration for Ti film thickness up to about 150 Å. Optionally, the seed layer of TiN may also be subjected to an $NH_3$ treatment step prior to the subsequent TiN deposition to reduce the chlorine content in the TiN film. Using the present invention, a conformal Ti/TiN diffusion barrier can successfully be formed in a contact structure with an aspect ratio up to about 12:1.

BRIEF DESCRIPTION OF THE DRAWINGS

The teachings of the present invention can be readily understood by considering the following detailed description in conjunction with the accompanying drawings, in which:

FIG. 3a shows a process recipe for TiN deposition upon a Ti film thickness of less than 250 Å; and FIG. 3b shows a process recipe for TiN deposition upon a Ti film thickness between 250 Å to 300 Å.

DETAILED DESCRIPTION

The present invention addresses the problem of film peeling or hazing for the titanium/titanium nitride (Ti/TiN) barrier layer by providing special film treatment steps prior to the TiN film deposition upon the Ti film. Although the exact cause of the titanium tetrachloride ($TiCl_4$)-based Ti/TIN film failure is currently unknown, it is believed that the problem arises from the Ti film surface being attacked by hydrogen chloride (HCl), chlorine ($Cl_2$) or $TiCl_4$ during deposition of the TiN film. HCl is formed during the $TiCl_4/NH_3$ reaction used in subsequent TiN film deposition, while $Cl_2$ may be present in trace amount as a result of a chamber cleaning process. It is speculated that the surface and structure of a thicker Ti film renders it more vulnerable to attack by HCl, $Cl_2$ or $TiCl_4$ than a thin Ti film. The present invention provides a remedy by implementing two additional process steps after the deposition of the Ti film. The first step treats the Ti film with $NH_2$, and the second step deposits a thin TiN seed layer upon the $NH_3$-treated Ti film. Since these two steps are performed in the same process chamber and use the same process gases as those used for the TiN deposition, there is no significant impact on the throughput of the Ti/TiN integrated process. In fact, the bottleneck in the overall Ti/TiN integrated process is dictated mostly by the thickness of the Ti film—a thicker Ti film requires an increase in both the Ti deposition time and the $NH_3$ treatment time.

System 10

Figure 1:
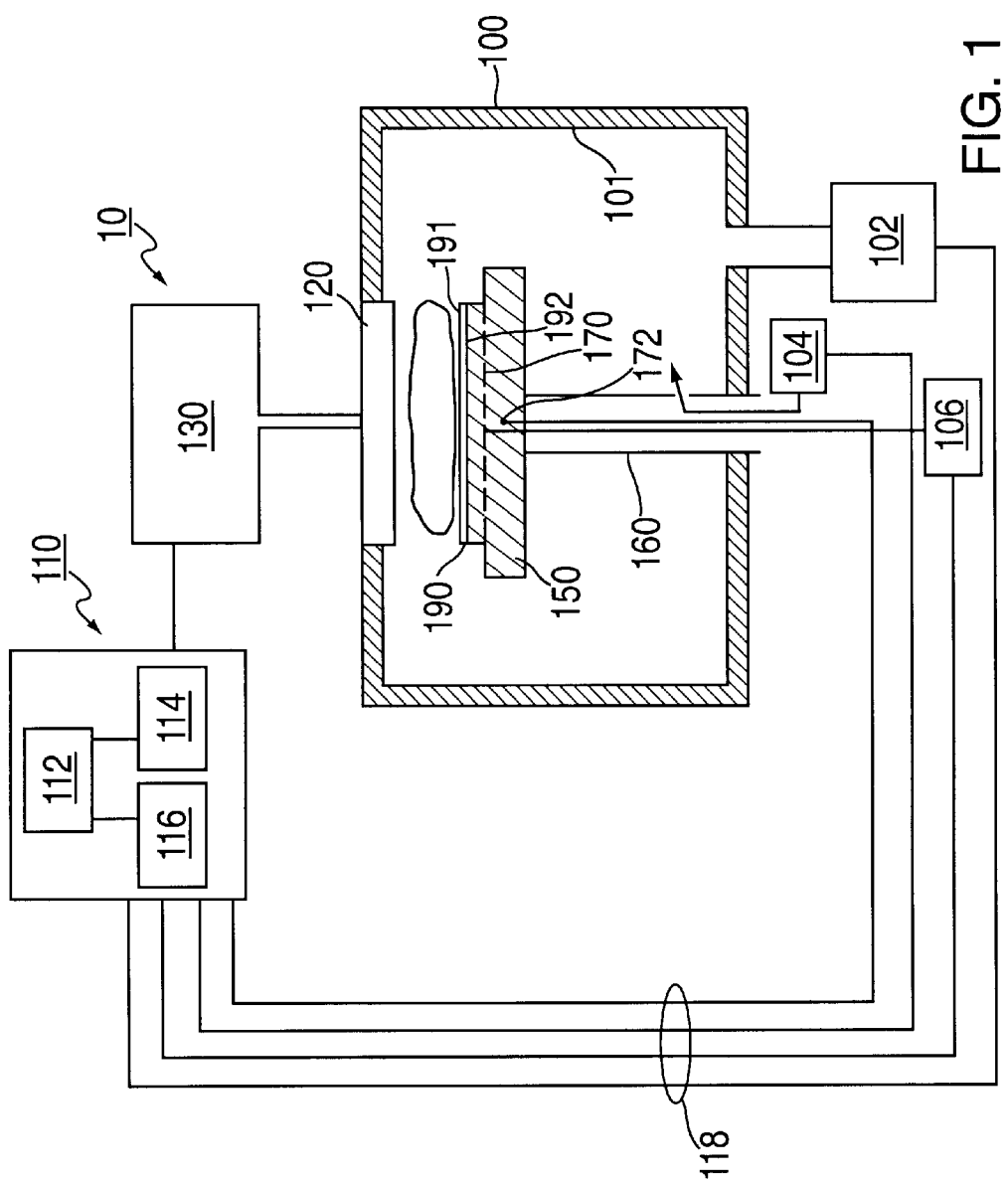
FIG. 1 depicts a schematic illustration of an apparatus that can be used for the practice of this invention.

FIG. 1 is a schematic representation of a wafer processing system 10 that can be used to practice embodiments of the present invention. The system 10 typically comprises a process chamber 100, a gas panel 130, a control unit 110, along with other hardware components such as power supplies and vacuum pumps. One example of the process chamber 100 is a TiN chamber, which has previously been described in a commonly-assigned U.S. patent application entitled "High Temperature Chemical Vapor Deposition Chamber," Ser. No. 09/211,998, filed on Dec. 14, 1998, and is herein incorporated by reference. Some key features of the system 10 are briefly described below.

Chamber 100

The process chamber 100 generally comprises a support pedestal 150, which is used to support a substrate such as a semiconductor wafer 190 within the process chamber 100. This pedestal 150 can typically be moved in a vertical direction inside the chamber 100 using a displacement mechanism (not shown). Depending on the specific process, the wafer substrate 190 has to be heated to some desired temperature prior to processing. In the present invention, the wafer support pedestal 150 is heated by an embedded heater 170. For example, the pedestal 150 may be resistively heated by applying an electric current from an AC supply 106 to the heater element 170. The wafer 190 is, in turn, heated by the pedestal 150, and can be maintained within a process temperature range of, for example, 450–750° C. A temperature sensor 172, such as a thermocouple, is also embedded in the wafer support pedestal 150 to monitor the temperature of the pedestal 150 in a conventional manner. For example, the measured temperature may be used in a feedback loop to control the power supply 106 for the heating element 170 such that the wafer temperature can be maintained or controlled at a desired temperature which is suitable for the particular process application.

Proper control and regulation of the gas flows through the gas panel 130 is performed by mass flow controllers (not shown) and a controller unit 110 such as a computer. The showerhead 120 allows process gases from the gas panel 130 to be uniformly distributed and introduced into the chamber 100. Illustratively, the control unit 110 comprises a central processing unit (CPU) 112, support circuitry 114, and memories containing associated control software 116. This control unit 110 is responsible for automated control of the numerous steps required for wafer processing—such as wafer transport, gas flow control, temperature control, chamber evacuation, and so on. Bi-directional communications between the control unit 110 and the various components of the system 10 are handled through numerous signal cables collectively referred to as signal buses 118, some of which are illustrated in FIG. 1.

A vacuum pump 102 is used to evacuate the process chamber 100 and to maintain the proper gas flows and pressure inside the chamber 100. A showerhead 120, through which process gases are introduced into the chamber 100, is located above the wafer support pedestal 150. The "dual-gas" showerhead 120 used in the present invention has two separate pathways, which allow two gases to be separately introduced into the chamber 100 without premixing. Details of the showerhead 120 have been disclosed in a commonly-assigned U.S. patent application entitled "Dual Gas Faceplate for a Showerhead in a Semiconductor Wafer Processing System," Ser. No. 09/098,969, filed Jun. 16, 1998 now U.S. Pat. No. 6,086,677; and is herein incorporated by reference. This showerhead 120 is connected to a gas panel 130 which controls and supplies, through mass flow controllers (not shown), various gases used in different steps of the process sequence. During wafer processing, a purge gas supply 104 also provides a purge gas, for example, an inert gas, around the bottom of the pedestal 150 to minimize undesirable deposits from forming on the pedestal 150.

Ti/TiN Film Integration

In one embodiment of the present invention, the process of the present invention is performed in an Applied Materials Centura 5200 cluster tool, incorporating a Ti chamber and a TiN chamber. After a Ti film is deposited over a wafer 190 by a conventional Ti deposition process such as CVD, the wafer 190 is loaded into a high temperature CVD process chamber for TiN deposition. As previously mentioned, details of this TiN process chamber have been disclosed in the commonly-assigned U.S. patent application entitled "High Temperature Chemical Vapor Deposition Chamber," Ser. No. 09/211,998, filed on Dec. 14, 1998. The chamber 100 incorporates a wafer support pedestal 150 made of aluminum nitride, which has an embedded resistive heater element 170. The heater 170 can be used to heat the pedestal 150 to a temperature within the range of 450–750° C. For example, with a heater temperature set at about 680° C., the wafer 190 can be maintained at about 640° C. during processing.

Figure 2A:
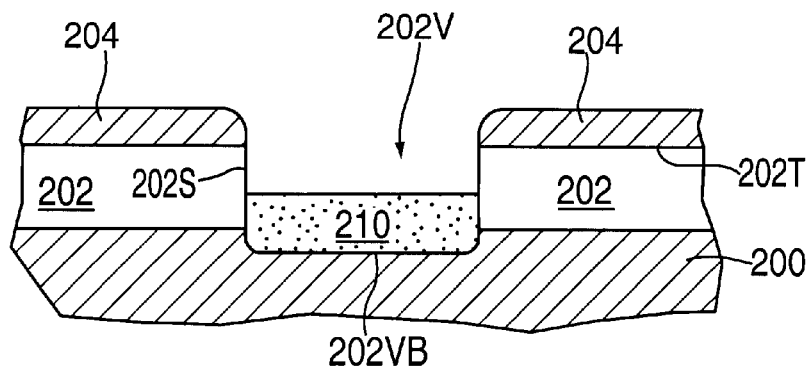
FIGS. 2a–2c depict schematic cross-sectional views of a substrate at different stages of film processing according to the present invention.
Figure 2B:
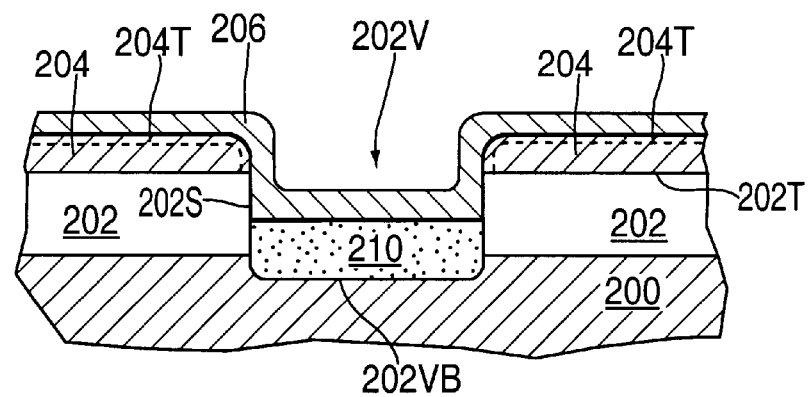
Figure 2C:
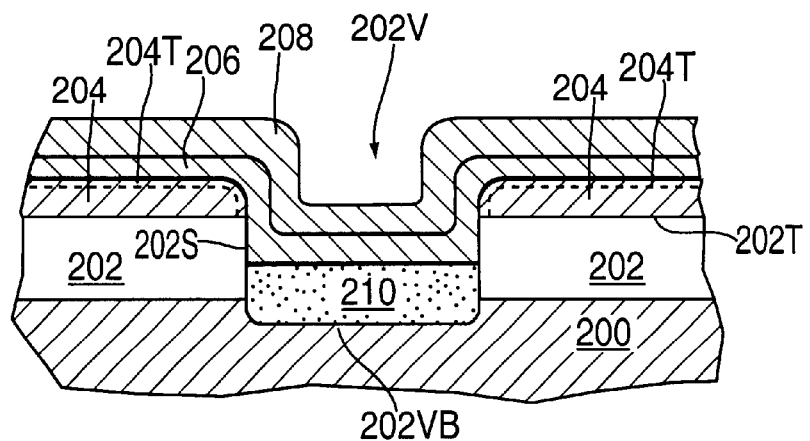

FIGS. 2a–c illustrate schematic cross-sectional views of a film structure upon a wafer substrate 190 at different stages of processing according to the present invention. FIG. 2a shows a cross-section of a wafer 190 with a Ti film 204 that has been deposited upon an underlying material layer 202. In this particular embodiment, the Ti film 204 is deposited upon an underlying $SiO_2$ layer 202, with a contact via 202V that has previously been conventionally formed during an earlier process step. During the initial stage of the Ti deposition (not shown), the Ti film 204 also contacts a portion of another material layer or substrate 200 at the bottom 202VB of the contact via 202V. Due to the non-conformal nature of the deposited Ti film 204, the sidewall 202S of the via 202V is not covered by any Ti film. If the Ti deposition is performed using chemical vapor deposition (CVD), typically at a high temperature between 600–700° C., a reaction will occur between the Ti film 204 and the silicon substrate 200 at the bottom 202VB of the contact via 202V. This leads to the formation of a titanium silicide ($TiSi_2$) layer 210, as shown in FIG. 2a. Alternatively, if the Ti film 204 is deposited using physical vapor deposition (PVD), then the $TiSi_2$ layer 210 can be formed in a separate RTN process. Note that the method of Ti film deposition is not critical to the practice of the present invention.

For Ti/TiN barrier layer, the Ti film 204 is typically about 100 Å thick at the top 202T of the underlying material layer 202, while that at the bottom 202VB of the contact via 202V is about 75 Å (prior to the formation of $TiSi_2$.) After reaction with the underlying silicon, the 75 Å Ti film will result in about 150 Å of $TiSi_2$. Depending on the specific Ti/TiN application, the underlying material layer 202 may be a dielectric such as silicon dioxide ($SiO_2$), and material substrate 200 may be silicon (Si). The use of the specific material combination for layers 200 and 202 is meant for illustrative purpose only, and should not be construed as limitations in the process of the present invention.

An exemplary process recipe for the present invention is given in FIG. 3a, which shows the recipe for depositing 200 Å TiN film upon a Ti film of less than 250 Å. After a wafer substrate 190 having a film structure shown in FIG. 2a is loaded onto the pedestal heater 150, the helium (He), nitrogen ($N_2$), argon (Ar) dilutant and purge gas flows are established in step (1) at their respective settings with the throttle valve fully open. In this particular embodiment, He is used as a carrier gas and Ar as a dilutant for $TiCl_4$. In general, other gases, such as $N_2$ or other inert gases, can also be used as carrier or dilutant gases. Both gases are introduced into the chamber 100 at a flow rate of about 1000 sccm via one pathway of the dual-gas showerhead 120. $N_2$, which is used as a dilutant for ammonia ($NH_3$), is introduced into the chamber 100 at a flow rate of about 1000 sccm via the second pathway of the showerhead 120. A bottom inert gas purge flow (e.g., Ar) of about 2000 sccm is also established through a separate gas line (not shown) provided at the bottom of the chamber 100. In step (2), the throttle valve setting is adjusted such that a chamber pressure of about 10 torr is established when $NH_3$ is admitted into the chamber 100 (via the same pathway as $N_2$) at a flow rate of about 500 sccm in step (3). The use of the dual-gas showerhead 120 is important to preventing premixing, and thus premature reaction, between $NH_3$ and $TiCl_4$ prior to entering the chamber 100. The Ti film 204 is subject to this $NH_3$ treatment step (3) for a time duration equal to A sec, which increases with increasing thickness of the Ti film 204. For example, a treatment time of about 10 sec. suffices for a Ti film thickness of less than 150 Å, while 50 sec. and 70 sec. are required for 200 Å and 250 Å Ti films respectively. This treatment step (3) is performed with the wafer 190 at about 640° C. (pedestal heater at about 680° C.), and preferably at the pressure and gas flow rates shown in FIG. 3a. However, wider parameter ranges are also acceptable—e.g., a total pressure in the range of 3–30 torr, He flow of 500–2000 sccm, $N_2$ flow of 500–5000 sccm, Ar dilutant of 500–1000 sccm, Ar purge of 500–3000 sccm, and $NH_3$ flow of 50–500 sccm.

The purpose of this $NH_3$ treatment step is to render the top surface layer 204T (shown by the dashed line in 204) of the Ti film 204 unreactive towards attack by chlorine, HCl or $TiCl_4$. This may occur, for example, as a result of the top surface 204T of the Ti film 204 or Ti grain boundaries (not shown) being partly converted into a thin layer of TiN. Regardless of the exact mechanism for this $NH_3$ treatment, suffice to say that a top layer 204T of the Ti film 204 is chemically modified by exposure to $NH_3$ under the process conditions shown in step (3). As previously mentioned, thicker Ti films tend to exhibit failure more readily than thin films. By incorporating this $NH_3$ treatment step (3) into the TiN deposition process recipe, the Ti/TiN film failure can be avoided in Ti films for thickness up to about 150 Å. For manufacturing purposes, however, an additional safety margin is required. Therefore, another special step—that of seed layer formation, is implemented prior to the normal deposition of a TiN film over the treated Ti film 204.

FIG. 2b illustrates a seed layer 206 of about 50 Å of TiN being deposited over the $NH_3$-treated Ti film 204. This is accomplished by implementing steps (4) and (5) shown in FIG. 3a. A liquid injection system (not shown) is used to introduce $TiCl_4$ into the chamber 100 in step (4) at a rate equal to about 1 mg/min. After the $TiCl_4$ flow has been stabilized for about 10 sec., the flow rate is increased to about 70 mg/min. (approximately 8 sccm vapor flow rate) in step (5). During the 7.5 sec. of step (5), a TiN seed layer 206 is formed from a thermal reaction between $TiCl_4$ and $NH_3$ under an $NH_3$-rich condition. The $TiCl_4/NH_3$ ratio is preferably maintained at about 1:60, with $TiCl_4$ flow rate at about 7–8 sccm, $NH_3$ flow rate at about 500 sccm, along with a total inert gas flow rate of about 3000 sccm at a total pressure of about 10 torr.

As shown in FIG. 3a, the inert gas flow consists of He, $N_2$ and Ar at respective flow rates of 1000 sccm. Other flow and pressure ranges are also acceptable—e.g., $TiCl_4$ flow of 5–20 sccm, $NH_3$ flow of 50–500 sccm, along with the inert dilutant, purge flow and pressure ranges similar to those given previously in the NH3 treatment step (3). In general, the relative ratio of $TiCl_4$ and $NH_3$ has a direct bearing on the Cl content, step coverage and the crystalline structure of a deposited TiN film. A mixture with a lower $TiCl_4:NH_3$ ratio leads to a lower Cl content in the deposited TiN film, but the step coverage may be relatively poor. On the other hand, a reaction mixture with a higher $TiCl_4:NH_3$ ratio results in a TiN film with good step coverage but high Cl-content. The present invention strikes a compromise by depositing a seed layer 206 of TiN film under an $NH_3$-rich condition, which results in a film with chlorine content of less than 1%. Furthermore, the crystalline structure of the deposited TiN film is affected by the amount of $NH_3$ used. For example, a deposited TiN film exhibits a columnar crystalline structure of <200> under the normal deposition condition, such as that shown in step (6) of FIG. 3a. As the amount of $NH_3$ is increased relative to $TiCl_4$, the TiN film structure changes to that of <111>. The <111> structure tends to exhibit better film properties such as a lower chlorine content and increased stability upon exposure to air or moisture. Thus, it is desirable to use an $NH_3$-rich condition during seed layer formation, such as that shown in step (5). In this context, an $NH_3$-rich condition may refer generally to one in which the $NH_3:TiCl_4$ ratio is higher than (e.g., at least 4 to 6 times) that used in the regular deposition for the bulk TiN film. Alternatively, an $NH_3$-rich condition may also be defined as having a ratio of $NH_3:TiCl_4$ greater than, for example, about 25:1 to 30:1.

The seed layer 206 should preferably be only about 50 Å thick. Even though the step coverage for this process step is poor—about 25% (ratio of TiN thickness at the sidewall 202S to TiN over 204T is 1:4), it does not pose a major issue for the final TiN film because of the small thickness of this seed layer 206. The combination of the low Cl-content TiN seed layer 206 and the previously $NH_3$-treated Ti film 204 provides the key to forming a reliable Ti/TiN diffusion barrier layer with minimal film failure.

Prior to the main TiN film deposition step (6), the TiN seed layer 206 can optionally be subjected to another $NH_3$ treatment step, in order to eliminate additional chlorine from the TiN seed layer 206. The same processing conditions as in step (3) above can be used for treating this TiN seed layer 206.

Finally, TiN film deposition under the regular process conditions is performed in step (6), resulting in a structure illustrated in FIG. 2c, where a TiN film 208 is formed over the seed layer 206. Step (6) is preferably performed at a pressure of about 10 torr, a $TiCl_4$ flow rate of about 170 mg/min (approximately 20 sccm vapor flow rate) in He carrier of about 1000 sccm, Ar dilulant of 1000 sccm, $NH_3$ flow rate of about 100 sccm with $N_2$ at about 1000 sccm. A bottom purge flow, such as Ar, is also maintained at about 2000 sccm. The recipe in step (6) results in a 100% conformal TiN film 208 with about 1.5% chlorine content. For the Ti/TiN barrier layer application, a 200 Å TiN film can be formed in about 15 sec. In general, the TiN deposition rate increases with increasing total pressure, and a range of 3–30 torr can also be used in this bulk layer deposition step (6). Again, wider parameter ranges are acceptable—e.g., $TiCl_4$ flow of 5–40 sccm, $NH_3$ flow of 50–500 sccm, He flow of 500–2000 sccm, $N_2$ flow of 500–5000 sccm, Ar dilutant flow of 500–1000 sccm and a purge flow of 500–3000 sccm. Other gases, such as $N_2$ or other inert gases, may also be used as carrier or dilutant gases.

After TiN film deposition, the $TiCl_4$ flow is turned off, while $NH_3$ and other inert gas flows are maintained at their previous flow rates for about 20 sec. in step (7). This step is used to reduce the chlorine content in the deposited TiN film 208 and thereby lower the resistivity of the TiN film 208. $NH_3$ is shut off in the subsequent purge and pump steps (8) and (9), which are implemented with the inert gas flow rates as shown in FIG. 3a and the throttle valve in its fully open position.

The incorporation of both $NH_3$ treatment of the Ti film and the deposition of a TiN seed layer in the TiN deposition recipe eliminates Ti/TiN film failure for Ti film thickness up to about 300 Å. It is important to note that if either one of these steps is used alone, successful Ti/TiN integration can be achieved for Ti film thickness of up to about 150 Å. Using the process sequence of the present invention, conformal Ti/TiN diffusion barrier can be achieved for aspect ratios up to about 12:1.

While the recipe illustrated in FIG. 3a can be used successfully for a Ti film thickness of less than about 250 Å, a slightly modified recipe is required for a Ti film thickness between 250 Å and 300 Å. This is shown in FIG. 3b, in which the $NH_3$ treatment of the Ti film 204 during step (3) is increased to 80 sec., with steps (1) and (2) being identical to hose illustrated in FIG. 3a. A 50 Å TiN seed layer 206 is subsequently deposited using steps (4) and (5), which are identical to that shown in FIG. 3a. In contrast to the previous recipe, however, another $NH_3$ treatment step (6) is implemented after the formation of the TiN seed layer 206 in step (5). This additional treatment step (6) is necessary because the surface of the thicker underlying Ti film 204 (thickness greater than 250 Å) is too rough to be completely covered by 50 Å of the TiN seed layer 206. Step (6) serves to provide additional TiN film coverage to prevent film peeling or hazing. As illustrated in FIG. 3b, an additional step (7) is also used to stabilize the $TiCl_4$ liquid flow at about 130 mg/min, or approximately 15 sccm vapor flow rate, prior to the TiN deposition step (8). This is necessary to account for an inherent time lag, arising from dead spaces in the liquid flow control system, for $TiCl_4$ delivery into the chamber 100. After the TiN film deposition step (8), the recipe ends with the shut-off, purge and pump steps (9)–(11), which are identical to steps (7)–(9) used in the recipe of FIG. 3a. The carrier and dilutant gases shown in FIG. 3b are meant to be illustrative only, and other gases can be substituted as appropriate.

Although various embodiments which incorporate the teachings of the present invention have been shown and described in detail herein, those skilled in the art can readily devise many other varied embodiments that still incorporate these teachings.

What is claimed is:

1. A method of thin film processing comprising the step of:
    forming a seed layer of titanium nitride (TiN) having a thickness of about 50 Angstroms or less upon a titanium (Ti) film from a thermal reaction between titanium tetrachloride ($TiCl_4$) and ammonia ($NH_3$) under an $NH_3$-rich condition.

2. The method of claim 1, wherein said $NH_3$-rich condition has an $NH_3$ flow rate greater than 25 times that of a $TiCl_4$ flow rate.

3. The method of claim 2, further comprising the step of treating said Ti film with $NH_3$ prior to forming said seed layer of TiN.

4. The method of claim 3, further comprising the step of heating said Ti film during said treating step with $NH_3$.

5. The method of claim 1, further comprising the step of forming a TiN layer upon said seed layer.

6. The method of claim 1, wherein said seed layer is formed at a $TiCl_4$ flow rate of less than about 10 sccm.

7. The method of claim 5, further comprising the step of exposing said seed layer to $NH_3$ prior to forming said TiN layer upon said seed layer.

8. The method as in claim 5, wherein said steps of forming said seed layer and forming said TiN layer upon said seed layer are performed at a temperature of about 640° C.

9. A method of thin film processing comprising the steps of:
    (a) forming a seed layer of titanium nitride (TiN) having a thickness of about 50 Angstroms or less upon a titanium (Ti) film; and
    (b) forming a TiN layer upon said seed layer; wherein said TiN layer and said seed layer are formed from a thermal reaction between titanium tetrachloride ($TiCl_4$) and ammonia ($NH_3$); and said step (a) is performed under an $NH_3$-rich condition.

10. The method of claim 9, wherein said $NH_3$-rich condition in said step (a) has an $NH_3$:$TiCl_4$ flow rate ratio greater than 4 times of that used in said step (b).

11. The method of claim 10, further comprising the steps of heating and treating said Ti film in $NH_3$ prior to forming said seed layer upon said Ti film.

12. The method of claim 10, wherein said seed layer is formed at a $TiCl_4$ flow rate of less than about 10 sccm.

13. The method of claim 11, further comprising the step of treating said seed layer with $NH_3$ prior to said step (b).

14. The method of claim 13, wherein all said steps are performed at a temperature of about 640° C.

15. A method of thin film processing comprising the steps of:
    (a) heating a substrate having a titanium (Ti) film;
    (b) treating said Ti film with ammonia ($NH_3$);
    (c) forming a seed layer of titanium nitride (TiN) upon said treated Ti film under an $NH_3$-rich condition;
    (d) treating said seed layer of TiN with $NH_3$; and
    (e) forming a TiN layer upon said treated seed layer.

16. The method of claim 15, wherein said seed layer in said step (c) and said TiN layer in said step (e) are formed from a reaction between titanium tetrachloride ($TiCl_4$) and $NH_3$.

17. The method of claim 15, wherein said step (c) is performed at a $TiCl_4$ flow rate of less than about 10 sccm.

18. The method of claim 15, wherein an $NH_3$ flow rate in said step (c) is greater than 25 times of an $TiCl_4$ flow rate.

19. The method of claim 16, wherein said $NH_3$-rich condition in step (c) has an $NH_3$:$TiCl_4$ flow rate ratio of greater than 4 times of an $NH_3$:$TiCl_4$ flow rate ratio used in step (e).

20. A method of thin film processing comprising the steps of:
    (a) heating a substrate having a titanium film to a temperature of about 640° C.;
    (b) treating said titanium film with an ammonia gas flow of about 500 sccm in the presence of a total inert dilutant flow of about 3000 sccm and a purge gas flow of about 2000 sccm at a total pressure of about 10 torr;
    (c) forming a seed layer of titanium nitride upon said treated titanium film from a reaction between $TiCl_4$ and $NH_3$ wherein an $NH_3$:$TiCl_4$ flow rate ratio is at least about 30:1 at a total pressure of about 10 torr in the presence of a total inert dilutant flow of about 3000 sccm and a purge gas flow of about 2000 sccm; and
    (d) forming a material layer of titanium nitride upon said seed layer from a reaction between $TiCl_4$ and $NH_3$ wherein an $NH_3$:$TiCl_4$ flow rate ratio is about 5:1 at a total pressure of about 10 torr in the presence of a total inert dilutant flow of about 3000 sccm and a purge gas flow of about 2000 sccm.

21. A method of thin film processing comprising the steps of:
    (a) forming a seed layer of titanium nitride having a thickness of not more than about 50 Angstroms upon a titanium film; and
    (b) forming a TiN layer upon said seed layer;
    wherein said TiN layer and said seed layer are formed from a reaction between titanium tetrachloride ($TiCl_4$) and ammonia ($NH_3$), and said step (a) is performed at an $NH_3$:$TiCl_4$ flow rate ratio greater than 25.

22. The method of claim 21, wherein said $NH_3$:$TiCl_4$ flow rate ratio in said step (a) is about 60.

* * * * *